United States Patent
Beukema et al.

(10) Patent No.: US 10,681,802 B1
(45) Date of Patent: Jun. 9, 2020

(54) DIFFERENTIAL LINE TIME SKEW COMPENSATION FOR HIGH DATA RATE RECEIVERS

(71) Applicant: International Business Machines Corporation, Armonk, NY (US)

(72) Inventors: Troy J. Beukema, Briarcliff Manor, NY (US); Jonathan E. Proesel, Mount Vernon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/560,950

(22) Filed: Sep. 4, 2019

(51) Int. Cl.
*H03K 19/0175* (2006.01)
*H05K 1/02* (2006.01)
*H04L 25/14* (2006.01)
*H04L 25/02* (2006.01)

(52) U.S. Cl.
CPC ....... *H05K 1/0248* (2013.01); *H04L 25/0272* (2013.01); *H04L 25/14* (2013.01); *H05K 1/0245* (2013.01)

(58) Field of Classification Search
None
See application file for complete search history.

(56) References Cited

U.S. PATENT DOCUMENTS

| | | |
|---|---|---|
| 7,786,750 B2 | 8/2010 | Logan |
| 8,108,710 B2 | 1/2012 | Zabinski |
| 8,422,590 B2 | 4/2013 | Leibowitz et al. |
| 8,896,352 B2 | 11/2014 | Huang et al. |
| 9,065,399 B2 | 6/2015 | Wang et al. |
| 2013/0064326 A1* | 3/2013 | Chen ................... H04L 25/0276 375/316 |
| 2019/0123551 A1* | 4/2019 | Yuan ...................... H02H 9/045 |

FOREIGN PATENT DOCUMENTS

EP     2238708 B1     1/2014

OTHER PUBLICATIONS

Frisch, "Handling differential skew in high-speed serial buses", EDN network 2006. https://www.edn.com/design/communications-networking/4316304/Handling-differential-skew-in-high-speed-serial-buses p. 1-3.
Bob Ross, T-Coils and Bridged-T Networks, European IBIS Summit, Naples, Italy May 11, 2011, pp. 1-24.

* cited by examiner

*Primary Examiner* — Anh Q Tran
(74) *Attorney, Agent, or Firm* — Daniel Morris; Otterstedt, Wallace & Kammer, LLP

(57) ABSTRACT

P and N termination networks couple a P line and an N line to corresponding receiver inputs. Each termination network includes an electrostatic discharge protection T-coil having an input port coupled to the corresponding line, a terminal port, and a center tap port. At least one of the termination networks further includes at least one delay T-coil having a terminal port, a center tap port, and an input port coupled to the terminal port of a corresponding one of the electrostatic discharge protection T-coils. In a no delay mode, a multiplexer selectively connects the P and N electrostatic discharge protection T-coil center tap ports to the P and N inputs of the receiver. In a delay mode, the multiplexer selectively connects the delay T-coil center tap port to a corresponding one of the P input of the receiver and the N input of the receiver.

20 Claims, 4 Drawing Sheets

DIFFERENTIAL LINE TIME SKEW COMPENSATION FOR HIGH DATA RATE RECEIVERS

BACKGROUND

The present invention relates to the electrical, electronic and computer arts, and more specifically, to analog, mixed signal design and communications technologies.

Modern electrical data transmission systems in networking and computing systems typically employ active SERDES (serializer/deserializer) based line drivers and receivers connected by an external passive differential transmission line, as shown in FIG. 1. Note the transmitter 101, receiver 103, and differential transmission line 105. The differential transmission line has well-known significant advantages for high data rate transmission, including improved line crosstalk, common mode noise suppression, and reduced EMI radiation, as compared to single-ended data links. The transmitter 101 includes serializer 111 with data input, coupled to differential line driver 113. The receiver 103 includes differential line receiver 115 coupled to deserializer 117 with data output.

As data rates increase from 10 Gbs/s to 28 Gb/s to 56 Gb/s to 100 Gb/s and higher in modern systems, a significant problem arises in the passive differential line due to a potential time delay difference between the two distinct lines in the differential system. This time delay difference arises due to practical non-idealities in constructing the transmission line, such as differing impact of fiber weave in a board laminate on one physical line vs. a second line, or small variations in line width or height with respect to the ground reference plane, which impact the characteristic impedance or "ZO" of the line and can impart different delay characteristics.

The delay difference is referred to herein as "PN skew," where P line 107P represents one of the differential pair lines 105 (positive signal polarity reference) and N line 107N represents the second of the differential pair lines 105 (negative signal polarity reference) as diagrammed in FIG. 1. The PN skew may be improved in manufacturing by using higher-cost techniques, but in typical modern systems can be in a range, for example, of 0.5 ps/inch to 1 ps/inch delay difference between the P and N lines. For a typical 30-inch long microstrip transmission line channel, this can result in 15 ps to 30 ps delay difference between the P and N lines of a differential pair. For a modern high data rate system such as a 100 Gb/s system, the transmission symbol rate of the system may be well over 50 Gbaud/s, resulting in a symbol period of ~20 ps. When a differential line has a delay difference of 1 symbol period, it will exhibit essentially infinite transmission loss at the BAUD/2 frequency, greatly impairing the ability of a transceiver to send data through the line. The skew problem can be mitigated at the board design level by either using shorter channels so less PN skew is built up, or resorting to expensive manufacturing techniques which inherently reduce the skew. Using shorter channels may be impractical in many system designs, and increased expense of building the passive channel can make the entire system unprofitable to construct.

SUMMARY

Principles of the invention provide techniques for differential line time skew compensation for high data rate receivers. In one aspect, an exemplary apparatus includes a receiver having P and N inputs and having an output; a differential input line pair having a P line and an N line; a P termination network coupling the P line to the P input of the receiver; and an N termination network coupling the N line to the N input of the receiver. The P termination network includes a P electrostatic discharge protection T-coil having an input port coupled to the P line, a terminal port, and a center tap port; and the N termination network includes an N electrostatic discharge protection T-coil having an input port coupled to the N line, a terminal port, and a center tap port. At least one of the P termination network and the N termination network further includes at least one delay T-coil having a terminal port, a center tap port, and an input port coupled to the terminal port of a corresponding one of the P electrostatic discharge protection T-coil and the N electrostatic discharge protection T-coil. Also included is a multiplexer selectively connecting: in a no delay mode, the P electrostatic discharge protection T-coil center tap port to the P input of the receiver and the N electrostatic discharge protection T-coil center tap port to the N input of the receiver; and, in a delay mode, the delay T-coil center tap port to a corresponding one of the P input of the receiver and the N input of the receiver; and, in the delay mode, another corresponding one of the N electrostatic discharge protection T-coil center tap port to the N input of the receiver and the P electrostatic discharge protection T-coil center tap port to the P input of the receiver.

In another aspect, an exemplary method includes coupling a receiver having P and N inputs and having an output to a differential input line pair having a P line and an N line via a P termination network coupling the P line to the P input of the receiver and an N termination network coupling the N line to the N input of receiver. The P termination network includes: a P electrostatic discharge protection T-coil having an input port coupled to the P line, a terminal port, and a center tap port; and the N termination network includes: an N electrostatic discharge protection T-coil having an input port coupled to the N line, a terminal port, and a center tap port. At least one of the P termination network and the N termination network further includes at least one delay T-coil having a terminal port, a center tap port, and an input port coupled to the terminal port of a corresponding one of the P electrostatic discharge protection T-coil and the N electrostatic discharge protection T-coil. A further step includes, with a multiplexer: in a no delay mode, selectively connecting the P electrostatic discharge protection T-coil center tap port to the P input of the receiver and the N electrostatic discharge protection T-coil center tap port to the N input of the receiver; and in a delay mode, selectively connecting the delay T-coil center tap port to a corresponding one of the P input of the receiver and the N input of the receiver; and, in the delay mode, selectively connecting another corresponding one of the N electrostatic discharge protection T-coil center tap port to the N input of the receiver and the P electrostatic discharge protection T-coil center tap port to the P input of the receiver.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Portions of some embodiments, such as a skew select block, include at least one processor, optionally coupled to off-chip memory, and operative to perform exemplary method steps.

Techniques of the present invention can provide substantial beneficial technical effects. For example, one or more embodiments provide one or more of:
lower differential signal loss resulting from PN skew,
suitability for high data rate applications,
reduced electromagnetic interference as compared to prior art techniques,
reduced differential-to-single-ended mode conversion in the channel, lowering single-ended noise at the receiver from differential mode excitation at the transmitter, and/or
reduced single-ended to differential mode conversion in the channel, lowering differential noise at the receiver from common mode excitation at the transmitter.

These and other features and advantages of the present invention will become apparent from the following detailed description of illustrative embodiments thereof, which is to be read in connection with the accompanying drawings.

DETAILED DESCRIPTION

Figure 1:
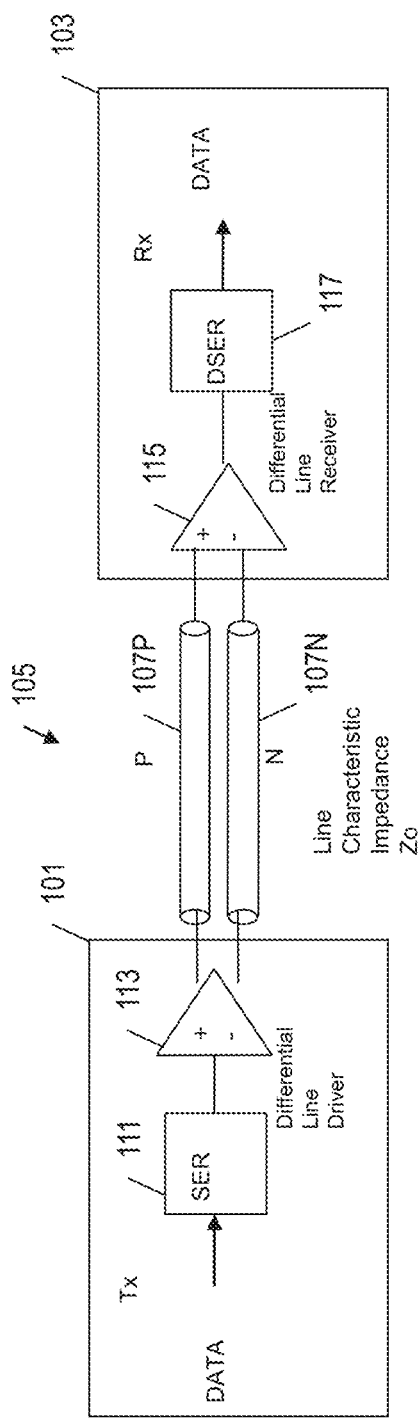
FIG. 1 depicts a data transmission system using a high speed serializer-deserializer (SERDES) with differential transmission lines according to the prior art.

One or more embodiments advantageously provide a method of compensating the PN skew in the line transceiver system. In modern high data rate receiver systems, both the transmitter and the receiver typically employ the well-known "T-coil" network to isolate both the transmitter line driver and the receiver differential line receiver capacitance from the line. A block diagram of a high data rate receiver passive input termination network, as is known in the art, is shown in FIG. 2.

In a common realization, the P and N lines 107P, 107N of a high-speed data channel are connected to input ports of constant-R T-coil structures 119P, 119N employed to isolate the capacitance arising from electro-static discharge (ESD) protection devices and receiver input buffer circuitry used in the receiver front end from the line. Reference characters with a "P" relate to the P path and reference characters with an "N" relate to the N path. In the absence of the T-coil, the transmission line would see a large capacitive impedance at its termination which would mis-match the characteristic impedance of the line and degrade both return-loss and insertion-loss of the channel. The ESD T-coil structure itself, detailed at 123 in FIG. 2 (representative of both 119P and 119N), includes two mutually-coupled inductors 125, 127 commonly bridged with a bridge capacitor Cs 129. By appropriately selecting values L1, L2, M, and Cs for the T-coil realization, a parasitic capacitance Cin 131 arising from the ESD protection devices and receiver input circuitry is effectively isolated from the IN terminal 133 of the T-coil, which presents a constant-R impedance to the line across frequency, improving impedance match of the termination to the line. The TERM port 135 of the T-coil is typically terminated in a nominal resistance 137P, 137N which matches the characteristic impedance of the line. In common realizations, this TERM impedance is typically in the range of 42 to 50 ohms. In a practical realization, due to series resistance in the T-coil inductors, the termination resistance itself is normally lower than the characteristic impedance of the line, so that the DC resistance at the T-coil IN port shows a 50 ohm termination.

Figure 2:
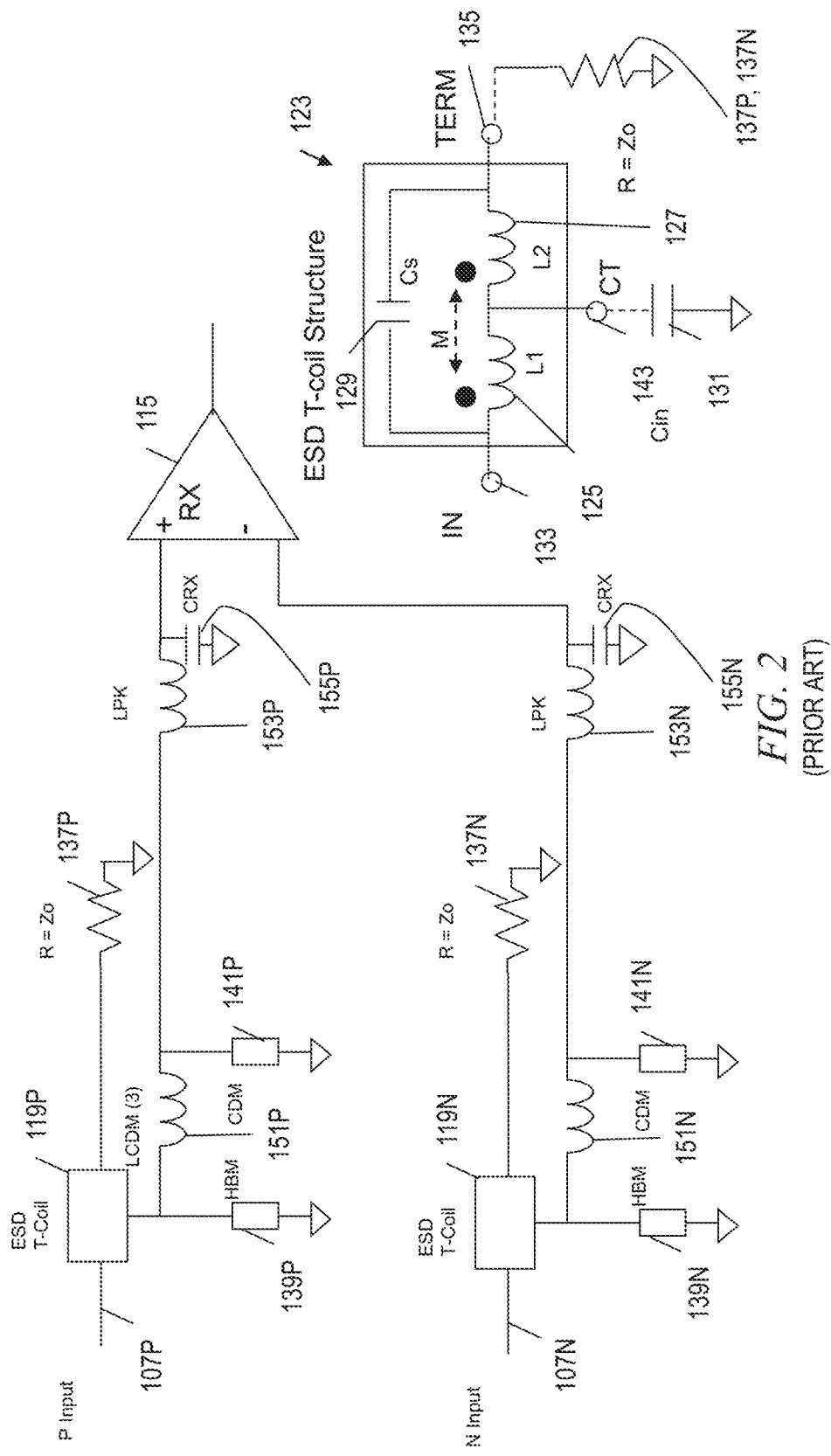
FIG. 2 depicts a high data rate receiver line termination network with T-coils and electro-static discharge (ESD) protection, according to the prior art.
Figure 3:
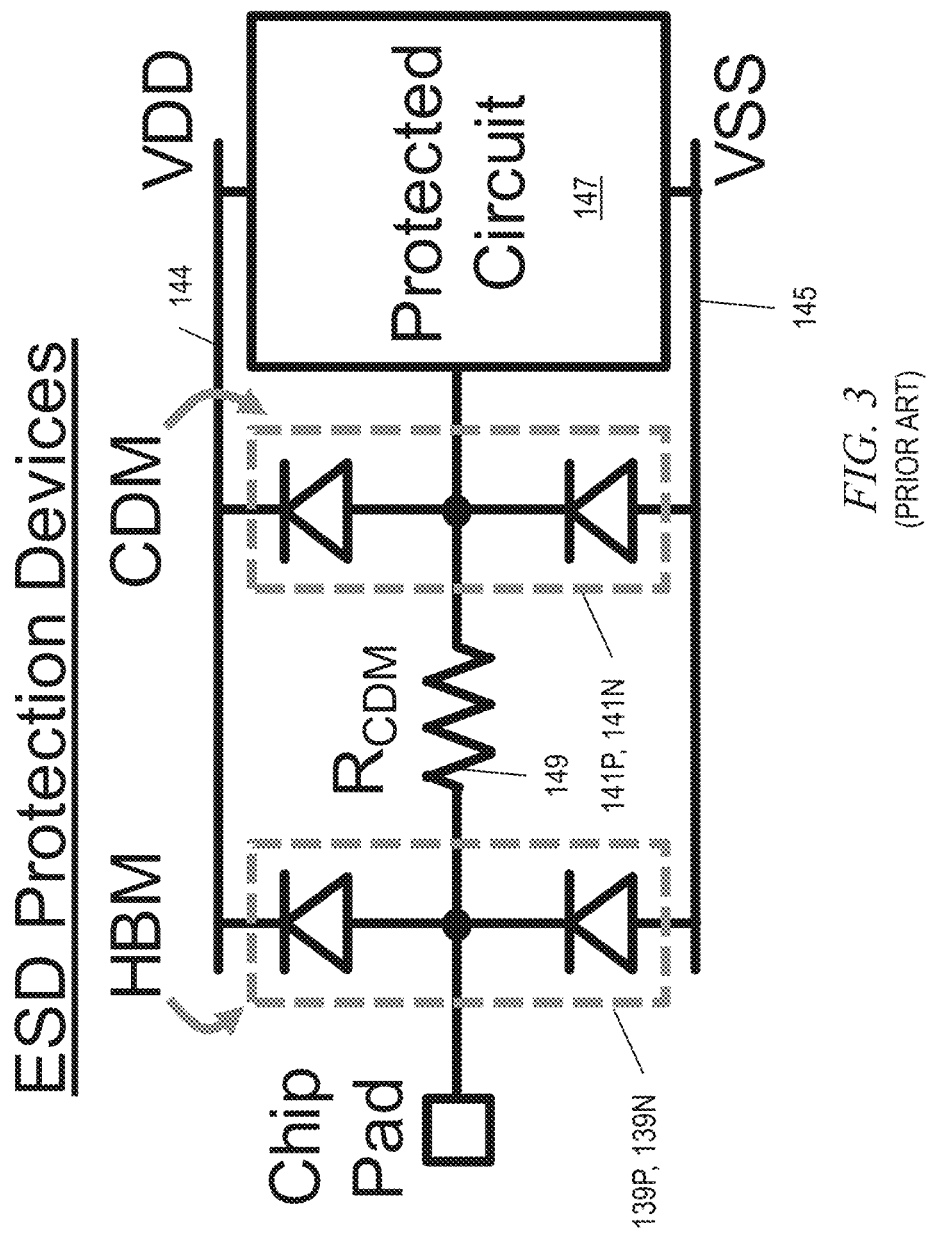
FIG. 3 depicts a Human Body Model (HBM) and Charged Device Model (CDM) ESD protection circuit, according to the prior art.

In a common realization, ESD protection structures comprise both Human Body Model (HBM) 139P, 139N and Charged Device Model (CDM) 141P, 141N protection devices connected to the center-tap (CT) port 143 of the T-coil as shown in FIG. 2 in the receiver line termination network. A simplified example HBM and CDM ESD protection circuit is shown in FIG. 3, using double-diode ESD protection devices to route discharge current to VDD or VSS supplies 144, 145 as required to avoid damage to the protected circuit 147. In an HBM ESD event, a 100 pF capacitor charged to a high voltage (e.g., 1 kV) is discharged through any two pins of an IC with a series resistance of 1.5 kΩ This HBM ESD discharge creates a unidirectional current through the IC; in the case of 1 kV, the peak current is 0.67 A. The HBM protection device (e.g., the double diode shown in FIG. 3) should thus have an on-resistance low enough to carry the peak current without developing a voltage greater than the technology maximum; typically, the on-resistance of an HBM ESD device is less than 1Ω to ensure a peak voltage less than 2.5 V.

In a CDM ESD event, the IC is charged to a high voltage (e.g., 250 V) relative to an external ground plane and discharged through a single pin. The resulting CDM current is a damped sinusoid with high peak current (3 to 5 A) and short duration (1 to 2 ns). The high current will cause the HBM protection device 139P, 139N to develop a voltage greater than 3 V across itself, potentially damaging any connected non-ESD devices (e.g. transistors, resistors, capacitors). To provide protection from the high voltage, a resistor $R_{CDM}$ 149 and CDM protection device 141P, 141N are added to create a voltage divider, limiting the voltage seen by the protected circuit 147 to less than 2 V. The HBM and CDM protection devices 139P, 139N; 141P, 141N of FIG. 2 can be realized by the double diode arrangement shown in FIG. 3. In the circuit of FIG. 2, the CDM resistor $R_{CDM}$ 149 in FIG. 3 is realized by the series resistance of the inductor $L_{CDM}$ 151P, 151N. The inductance of $L_{CDM}$ resonates out the capacitance of the CDM protection device. In FIG. 2, passive peaking inductors such as LPK 153P, 153N can also be used as part of the passive termination network to help resonate out parasitic capacitance CRX 155P, 155N from the receiver's active input buffer.

In the known art, the passive receiver termination network as described has no ability to mitigate increased data signal loss arising from delay differences in external P and N transmission lines. One or more embodiments advantageously lower differential signal loss resulting from PN skew by introducing a compensating delay on either the P or the N line of the received signal in the data receiver front end passive ESD compensation/termination network.

Figure 4:
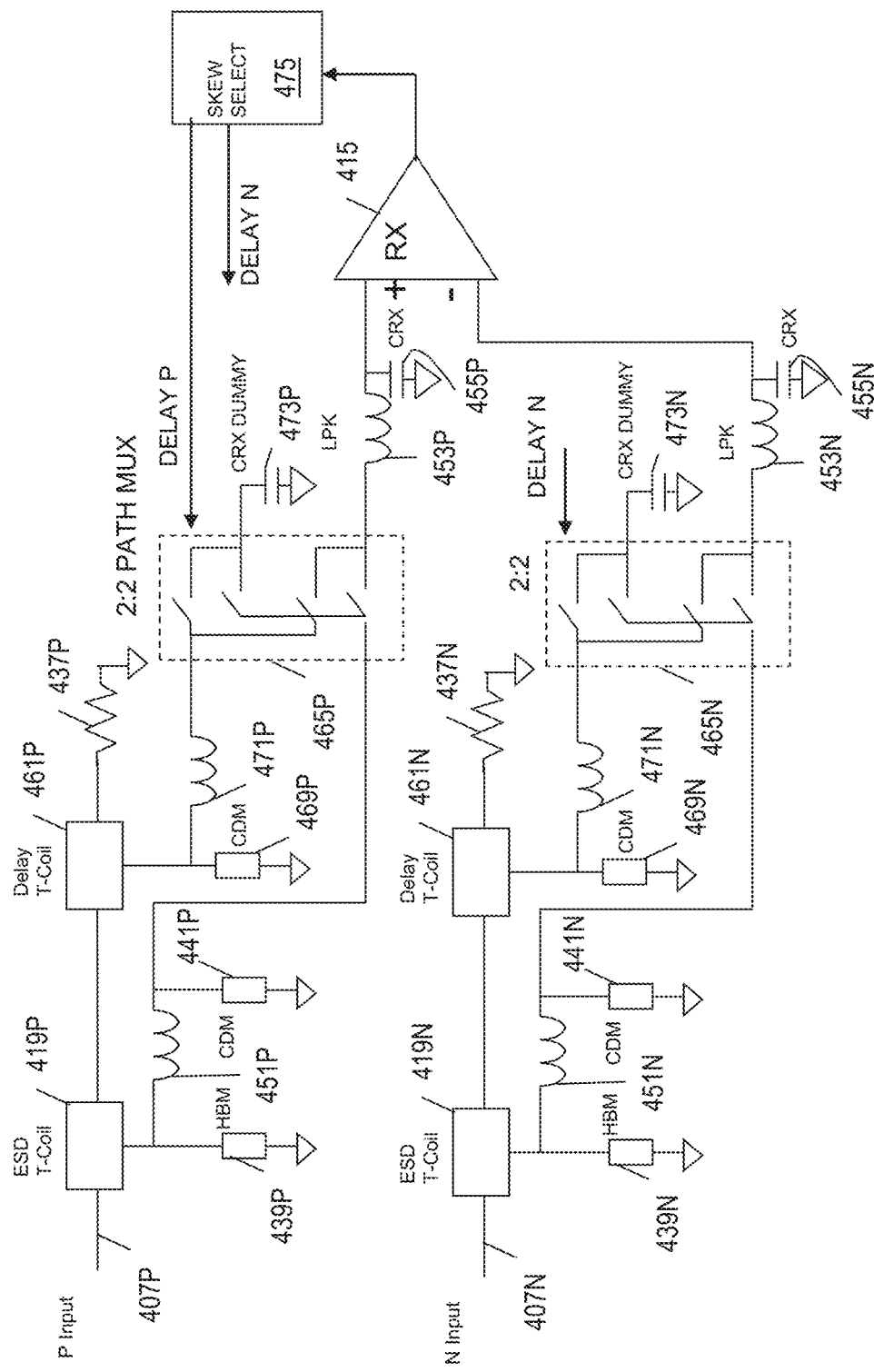
FIG. 4 depicts a differential line termination network with PN skew compensation, according to an aspect of the invention.

One or more embodiments augment the commonly used LC ESD T-coil based termination network described in FIG. 1 with a new dual T-coil structure which provides adjustable signal delay while maintaining line isolation of the receiver ESD and input capacitance. A block diagram of a non-limiting exemplary embodiment is shown in FIG. 4. Elements on FIG. 4 that are analogous to those in FIG. 2 have received the same reference character incremented by three hundred; that is to say, elements 407P, 407N, 415, 419P, 419N, 437P, 437N, 439P, 439N, 441P, 441N, 451P, 451N, 453P, 453N, and 455P, 455N are analogous to elements 107P, 107N, 115, 119P, 119N, 137P, 137N, 139P, 139N, 141P, 141N, 151P, 151N, 153P, 153N, and 155P, 155N. The exemplary embodiment replaces the resistive termination used in a conventional T-coil based line termination network with a second cascaded constant-R T-coil structure 461P, 461N. The second constant-R T-coil effectively provides a nominally constant resistance across frequency at its input port, so the first T-coil sees a constant-R load at its termination port as appropriate for proper operation. The introduction of the second T-coil creates two output nodes at the center tap (CT) of the first (primary) T-coil 419P, 419N and the second cascaded (delay) T-coil 461P, 461N with different time delays. The two output nodes from the cascaded T-coil structure are then tapped by a passive path multiplexer (mux) architecture 465P, 465N designed to maintain constant load on the passive T-coils as line skew compensation state is switched between no delay, delay P, delay N, or delay P and N. By maintaining constant capacitive load at the center taps of the T-coils, the T-coil designs can be optimized to achieve both good line impedance match and desirable transmission properties simultaneously while providing a programmable time delay on the P and N lines.

Both HBM and CDM ESD protection are provided by the three ESD protection devices on each input of FIG. 4. In particular, in the upper P input note HBM protection 439P, CDM protection 441P, and CDM protection 469P; while in the lower N input note HBM protection 439N, CDM protection 441N, and CDM protection 469N. The HBM ESD protection device functions as described in the prior art. As there are two paths from input to multiplexer, both paths should be protected by a series resistance and a CDM ESD protection device to form the appropriate voltage divider. The first series resistance is realized by the inductor 451P, 451N series resistance between the HBM device and the first CDM device. The second series resistance is realized by the T-coils' series resistance 419P, 461P and 419N, 461N between the HBM device 439P, 439N and the second CDM device 469P, 469N.

In a preferred but non-limiting embodiment, a delay difference of approximately 17 ps is targeted between the primary T-coil output node and the cascaded delay T-coil output node. The 2:2 path mux 465P, 465N can select either the delayed path or the non-delayed path to route to the receiver input amplifier for both the P and N signals, enabling the structure to delay P with respect to N or to delay N with respect to P. Further, the 2:2 path mux 465P, 465N can provide a fourth state which selects the output of the delay T-coil for both P and N to provide more loss with no relative delay. This fourth state can be useful, for example, as a mechanism to passively attenuate strong input signals if the line has low skew. The 2:2 path mux can be realized, for example, with complementary metal oxide semiconductor (CMOS) transistors. Depending on the input common mode range, the path mux CMOS transistors may be either NMOS, PMOS, or both. The target delay of 17 ps is chosen for implementation practicality, but can be made smaller or larger with design tradeoffs. The 17 ps compensation delay provides benefit for a typical 50 Gbaud (50 to 100 Gb/s data rate) data transmission system by enabling it to lower the differential line loss associated with any P-N line skew mismatch greater than ½ of the compensation delay; here, 8.5 ps. For a line with 8.5 ps or less delay, the degradation impact on high-frequency signal loss is small enough that system performance with a 50 Gbaud (20 ps) symbol duration is not severely impacted and can normally be compensated with receiver equalization such as feed-forward equalizers (FFE) or decision-feedback equalizers (DFE).

Thus, with continued reference to FIG. 4, an exemplary differential line termination network with PN skew compensation capability is described. A received differential signal with single-ended line components P and N, respectively 407P, 407N each connect to the input of a first ESD T-coil 419P, 419N. The first ESD T-coil output (capacitive) node provides an ESD protection function using HBM ESD device 439P, 439N. The output of the HBM ESD diode in a non-limiting but preferred embodiment connects through a series inductor 451P, 451N to a second CDM ESD diode 441P, 441N. The output of CDM ESD diode 441P, 441N is then input to one of the input ports of the 2:2 path mux 465P, 465N. The output node of first ESD T-coil 419P, 419N connects to the input of a second delay T-coil 461P, 461N. The second delay T-coil 461P, 461N capacitive node is connected to a third CDM ESD diode 469P, 469N. The output of the third CDM ESD diode 469P, 469N in a preferred but non-limiting embodiment connects to an impedance match inductor 471P, 471N. The output of impedance match inductor 471 connects to the second input port of the 2:2 path mux 465P, 465N and represents a signal with excess delay relative to the first input of the 2:2 path mux 465P, 465N. One output of 2:2 path mux 465P, 465N is connected to a dummy capacitive load 473P, 473N which nominally matches the capacitive load of the second output. The second output of the 2:2 path mux 465P, 465N connects to the main data receiver circuit 415, which in a preferred but non-limiting embodiment comprises an integrated on-chip AC coupling (ACC) function and an amplifier input. In a preferred but non-limiting embodiment, peaking inductors 453P, 453N are used to tune out loss arising from receiver ACC/amplifier capacitance 455P, 455N at the input of the data receiver ACC and amplifier inputs.

In one or more embodiments, the 2:2 path mux 465P, 465N realizes four operating mux states which are set forth below:

State 1: Non-Delayed P, Non-Delayed N (No Delay)

The receiver data path P/N lines connect to the primary P/N T-coil outputs. A dummy capacitive load nominally equal in capacitance to the capacitance of the receiver data path inputs is connected to the delay T-coil outputs.

State 2: Delayed P, Non-Delayed N (Delay P)

The receiver data path P line connects to the P delay T-coil output. A dummy capacitive load connects to the P primary T-coil output. The receiver data path N line connects to the N primary T-coil output. A dummy capacitive load connects to the N delay T-coil output.

State 3: Non-Delayed P, Delayed N (Delay N)

The receiver data path P line connects to the P primary T-coil output. A dummy capacitive load connects to the P delay T-coil output. The receiver data path N line connects to the N delay T-coil output. A dummy capacitive load connects to the N primary T-coil output.

State 4: Delayed P, Delayed N (Delay P and N)

The receiver data path P/N lines connect to the delay P/N T-coil outputs. A dummy capacitive load nominally equal in capacitance to the capacitance of the receiver data path inputs is connected to the primary T-coil outputs.

In one or more embodiments, the optimal operating configuration of the 2:2 path mux is determined by the SKEW SELECT function 475. In a preferred embodiment, the data signal is processed by the receiver SKEW SELECT function 475, which is capable of estimating the relative loss of the received signal between DC (or low) and high frequencies, using techniques known in the art. As an illustrative example, one loss determination technique in a digital receiver is to compute a sum-of-products value of a received symbol stream against a constant reference symbol stream of "1" values, and a second sum-of-products value of a received symbol stream against an alternating "1" "−1" symbol sequence. These sum-of-products values are coarse estimates of the Fourier-transform of the signal at low frequency and high frequency. The values can be used directly to determine a ratio of high frequency loss relative to low frequency loss in the channel.

In one or more embodiments, the SKEW SELECT function configures the 2:2 path mux to minimize the high frequency loss (relative to low frequency). For example, the SKEW SELECT function, in a preferred but non-limiting embodiment, configures the 2:2 path mux operation state (delay P, delay N, or no delay) at the command of a system level generated PN-SKEW calibration request. As an illustrative example, the path mux state which provides the largest ratio high frequency loss to low frequency loss is selected as the optimal operating condition for the skew compensation system. Other techniques may be used by SKEW SELECT function 475 to select the optimum line skew compensation state. As an illustrative example, another appropriate technique is to sequentially configure the three path-mux states (delay P, delay N, and no delay) while adaptively equalizing the received data in each state. The optimal path mux state is then selected as the state which requires the lowest amount of high frequency equalization arising from the data receiver adaptive equalization process. The SKEW SELECT function can also be implemented at a system level using other indirect optimization techniques such as monitoring of system BER (e.g., pick the 2:2 path mux setting which gives the lowest bit-error rate, or BER, in systems capable of providing or estimating that information) or monitoring of any related soft-error metric such as the ratio of average received signal to root-mean-square (RMS) noise (signal-to-noise ratio, or SNR) detected on the received symbols commonly available in receiver systems using techniques known in the art.

One or more embodiments can have one or more of the following advantages over prior-art techniques:

Certain prior-art techniques compensate P N skew by varying the launch times of the P and N signals at the transmitter. This has a disadvantage of resulting in a P N skew on the external line with a large signal (at the transmitter before channel attenuation) which can increase EMI (electromagnetic interference) radiation. This approach also imbalances current draw at the transmitter, which can degrade power supply integrity. In contrast, one or more embodiments add the skew inside the receiver after the signal has gone through line attenuation, eliminating the potential of large PN skew directly at the transmitter, with no power supply integrity degradation.

Those prior-art techniques based on adjusting P N skew in a receiver front end using active circuit approaches, such as tunable active delay buffers, have the disadvantage of added power and potentially added signal distortion from the active circuitry. In contrast, one or more embodiments are fully passive, requiring no active circuits, and so can accomplish the P N skew compensation function with nominally no extra system power draw and no requirement for high speed active tunable delay buffers.

It will thus be appreciated that one or more embodiments provide a differential data receiver termination network with a built-in P-N skew compensation system, comprising a first primary T-coil 419P connected to a receiver P input providing at least one data path output; a second delay T-coil network 461P connected to the first primary P input T-coil providing at least one delayed data path output; a first primary T-coil 419N connected to a receiver N input providing at least one data path output; a second delay T-coil network 461N connected to the first primary N input T-coil providing at least one delayed data path output; and a path multiplexer 465P, 465N operationally connecting the primary and delay T coil data outputs to a receiver data path.

In one or more embodiments, the path multiplexers are 2:2 constant load path multiplexers.

One or more embodiments include an automatic SKEW select operation by the receiver based on minimizing high frequency loss or minimizing BER/maximizing symbol SNR.

One or more embodiments cascade more than one delay T-coil in general to provide more possible delays.

One or more embodiments provide a skew compensation network for a receiver which is fundamentally different from prior-art systems based on varying P and N launch times at a transmitter. Pre-skewing delay at the transmitter in prior art approaches can generate unwanted electromagnetic interference radiation and also requires a backchannel adaptation from a receiver device which needs to detect skew error for compensation; one or more embodiments do not suffer from these shortcomings.

One or more embodiments provide a new passive dual T-coil termination with passive path multiplexers, requiring no active buffers or adder circuits to realize the skew compensation function, as compared to prior-art receiver skew compensation systems based on active buffers and adders, which are not suitable for high data rate applications since the active buffers in prior art systems add bandwidth loss, nonlinear distortion, noise, and extra power to the system. One or more embodiments are suitable for high data rate applications.

As compared to one or more embodiments using passive T-coils, prior-art techniques using active inverters may be limited to signals such as lower frequency data or clocks; prior-art active inverters can add significant bandwidth loss, nonlinear distortion, noise and power draw to the data transmission system.

One or more embodiments do not use varying sampling clocks to achieve skew compensation, but rather employ varying delay in P and N paths.

Given the discussion thus far, it will be appreciated that, in general terms, an exemplary apparatus, according to an aspect of the invention, includes a receiver 415 having P and N inputs and having an output; a differential input line pair having a P line (e.g. connected to input 407P) and an N line (e.g. connected to input 407N); a P termination network coupling the P line to the P input of the receiver; and an N termination network coupling the N line to the N input of the receiver. In one or more embodiments, the P termination network includes a P electrostatic discharge protection T-coil 419P having an input port coupled to the P line, a terminal port, and a center tap port; and the N termination network includes an N electrostatic discharge protection T-coil 419N having an input port coupled to the N line, a terminal port, and a center tap port. At least one of the P termination network and the N termination network further includes at least one delay T-coil (461P or 461N) having a terminal port, a center tap port, and an input port coupled to the terminal port of a corresponding one of the P electrostatic discharge protection T-coil and the N electrostatic discharge protection T-coil.

Also included is a multiplexer (e.g. 465P, 465N) selectively connecting, in a no delay mode, the P electrostatic discharge protection T-coil's 419P center tap port to the P input of the receiver 415 and the N electrostatic discharge protection T-coil's 419N center tap port to the N input of the receiver 415. In a delay mode, the multiplexer selectively connects the delay T-coil center tap port to a corresponding one of the P input of the receiver and the N input of the receiver; and another corresponding one of the N electrostatic discharge protection T-coil center tap port to the N input of the receiver and the P electrostatic discharge protection T-coil center tap port to the P input of the receiver (i.e. if delay T-coil is in P line and connected by multiplexer to P input of receiver then center tap port of N ESD coil is connected to N input and vice versa).

It is to be understood that if only one of the P line and the N line has a delay coil, the ESD coil for that line could be hard wired and this still falls within the rubric of selective connection.

In one or more embodiments, both the P line and the N line have a delay coil. So, for example, in one or more embodiments, the at least one of the P termination network and the N termination network includes the P termination network; the delay T-coil includes a P delay T-coil 561P; the multiplexer includes: a P multiplexer 465P coupled to the center tap ports of the P electrostatic discharge protection T-coil and the P delay T-coil; and an N multiplexer 465N coupled to the center tap ports of the N electrostatic discharge protection T-coil and the N delay T-coil. Furthermore, the delay mode includes a P delay mode wherein the P multiplexer selectively connects the P delay T-coil center tap port to the P input of the receiver; the N termination network further includes an N delay T-coil 461N having a terminal port, a center tap port, and an input port coupled to the terminal port of the N electrostatic discharge protection T-coil; and the N multiplexer selectively connects the N delay T-coil center tap port to the N input of the receiver and the P multiplexer selectively connects the P electrostatic discharge protection T-coil center tap port to the P input of the receiver in an N delay mode.

Furthermore, in one or more embodiments, the P multiplexer and the N multiplexer selectively connect the P delay T-coil center tap port to the P input of the receiver and the N delay T-coil center tap port to the N input of the receiver in a PN delay mode.

In at least some instances, the apparatus further includes a P dummy capacitive load 473P coupled to the P delay T-coil center tap port and an N dummy capacitive load 473N coupled to the N delay T-coil center tap port in the no delay mode.

In the P delay mode, the P dummy capacitive load is coupled to the P primary T-coil center tap port and the N dummy capacitive load is coupled to the N delay T-coil center tap port.

In the N delay mode, the N dummy capacitive load is coupled to the N primary T-coil center tap port and the P dummy capacitive load is coupled to the P delay T-coil center tap port.

In the PN delay mode, the P dummy capacitive load is coupled to the P primary T-coil center tap port and the N dummy capacitive load is coupled to the N primary T-coil center tap port.

One or more embodiments further include a skew select block 475 having an input port coupled to appropriate received signal information available from the receiver 415, a DELAY P output coupled to the P multiplexer 465P and a DELAY N output coupled to the N multiplexer 465N to control the P multiplexer and the N multiplexer to selectively implement one of the no delay mode, the P delay mode, the N delay mode, and the PN delay mode. The skew select block includes, for example, logic to select one of the no delay mode, the P delay mode, and the N delay mode, g to provide optimal line skew compensation.

In one or more embodiments, the skew select block 475 includes custom digital circuitry, an FPGA, an ASIC, or even a suitably programmed microprocessor. Block 475 inputs available information output from the receiver 415 such as high frequency signal level, i.e. the signal level when a high frequency content data sequence such as alternating 1/0 (101010 . . . ) is received; signal amplitude; signal SNR (signal-to-noise ratio) determined using methods known in the art; received BER estimate if available in a specific transceiver system; etc. Block 475 controls the path mux select signal to adjust the skew to optimize the desired received signal characteristics (maximize high frequency signal amplitude, maximize SNR, minimize BER, etc.).

In some cases, the skew select block determines the optimal skew compensation based on a largest ratio high frequency loss to low frequency loss; based on minimizing high frequency equalization; based on minimizing bit error rate; and/or based on optimizing a soft error rate metric.

In another aspect, an exemplary method includes coupling a receiver 415 having P and N inputs and having an output to a differential input line pair having a P line (e.g. connected to input 407P) and an N line (e.g. connected to input 407N) via a P termination network coupling the P line to the P input of the receiver and an N termination network coupling the N line to the N input of receiver. The P termination network includes a P electrostatic discharge protection T-coil 419P having an input port coupled to the P line, a terminal port, and a center tap port. The N termination network includes an N electrostatic discharge protection T-coil 419N having an input port coupled to the N line, a terminal port, and a center tap port. At least one of the P termination network and the N termination network further includes a delay T-coil (461P or 461N) having a terminal port, a center tap port, and an input port coupled to the terminal port of a corresponding one of the P electrostatic discharge protection T-coil and the N electrostatic discharge protection T-coil. A further step includes, with a multiplexer (e.g., 465P, 465N), in a no delay mode, selectively connecting the P electrostatic discharge protection T-coil's 419P center tap port to the P input of the receiver 415 and the N electrostatic discharge protection T-coil's 419N center tap port to the N input of the receiver 415.

Further steps include, in a delay mode, with the multiplexer, selectively connecting the delay T-coil center tap port to a corresponding one of the P input of the receiver and the N input of the receiver; and, in the delay mode, selectively connecting another corresponding one of the N electrostatic discharge protection T-coil center tap port to the N input of the receiver and the P electrostatic discharge protection T-coil center tap port to the P input of the receiver.

In one or more embodiments, both the P line and the N line have a delay coil. So, for example, in one or more embodiments, the at least one of the P termination network and the N termination network includes the P termination network; the delay T-coil includes a P delay T-coil 561P; the multiplexer includes: a P multiplexer 465P coupled to the center tap ports of the P electrostatic discharge protection T-coil and the P delay T-coil; and an N multiplexer 465N coupled to the center tap ports of the N electrostatic discharge protection T-coil and the N delay T-coil. Furthermore, the delay mode includes a P delay mode wherein the P multiplexer selectively connects the P delay T-coil center tap port to the P input of the receiver; the N termination network further includes an N delay T-coil 461N having a terminal port, a center tap port, and an input port coupled to the terminal port of the N electrostatic discharge protection T-coil. A further step includes the N multiplexer selectively connecting the N delay T-coil center tap port to the N input of the receiver; and said P multiplexer selectively connecting the P electrostatic discharge protection T-coil center tap port to the P input of the receiver in an N delay mode.

One or more embodiments include the further step of, with the P multiplexer 465P and the N multiplexer 465N, selectively connecting the P delay T-coil's 461P center tap port to the P input of the receiver 415 and the N delay T-coil's 461N center tap port to the N input of the receiver 415 in a PN delay mode.

In one or more embodiments, the P termination network further includes a P dummy capacitive load 473P and the N termination network further includes an N dummy capacitive load 473N. Further steps then include coupling the P dummy capacitive load to the P delay T-coil center tap port and the N dummy capacitive load to the N delay T-coil center tap port in the no delay mode; coupling the P dummy capacitive load to the P primary T-coil center tap port and the N dummy capacitive load to the N delay T-coil center tap port in the P delay mode; coupling the N dummy capacitive load to the N primary T-coil center tap port and the P dummy capacitive load coupled to the P delay T-coil center tap port in the N delay mode; and coupling the P dummy capacitive load to the P primary T-coil center tap port and the N dummy capacitive load to the N primary T-coil center tap port in the PN delay mode.

One or more embodiments further include, with a skew select block 475 having an input port coupled to appropriate received signal information available from the receiver 415, a DELAY P output coupled to the P multiplexer and a DELAY N output coupled to the N multiplexer, controlling the P multiplexer and the N multiplexer to selectively implement one of the no delay mode, the P delay mode, the N delay mode, and the PN delay mode.

In one or more instances, a further step includes selecting one of the no delay mode, the P delay mode, and the N delay mode, having optimal skew compensation.

One or more embodiments still further include determining the optimal skew compensation based on a criterion selected from the group consisting of: a largest ratio high frequency loss to low frequency loss; minimizing high frequency equalization; minimizing bit error rate; and monitoring a soft error rate metric.

As noted, portions of some embodiments, such as a skew select block, include at least one processor, optionally coupled to off-chip memory, and operative to perform exemplary method steps.

Memory can include, for example, volatile memory, such as random access memory (RAM) and/or non-volatile memory such as read-only memory (ROM).

Computer software including instructions or code for performing the methodologies of the skew select block, as described herein, may be stored in one or more of the associated memory devices (for example, ROM, fixed or removable memory) and, when ready to be utilized, loaded in part or in whole (for example, into RAM) and implemented by a processor. Such software could include, but is not limited to, firmware, resident software, microcode, and the like.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a receiver having P and N inputs and having an output;
a differential input line pair having a P line and an N line;
a P termination network coupling said P line to said P input of said receiver;
an N termination network coupling said N line to said N input of said receiver;
said P termination network comprising:
  a P electrostatic discharge protection T-coil having an input port coupled to said P line, a terminal port, and a center tap port;
said N termination network comprising:
  an N electrostatic discharge protection T-coil having an input port coupled to said N line, a terminal port, and a center tap port;
at least one of said P termination network and said N termination network further comprising at least one delay T-coil having a terminal port, a center tap port, and an input port coupled to said terminal port of a corresponding one of said P electrostatic discharge protection T-coil and said N electrostatic discharge protection T-coil; and
a multiplexer selectively connecting:
  in a no delay mode, said P electrostatic discharge protection T-coil center tap port to said P input of said receiver and said N electrostatic discharge protection T-coil center tap port to said N input of said receiver; and
  in a delay mode, said delay T-coil center tap port to a corresponding one of said P input of said receiver and said N input of said receiver; and
  in said delay mode, another corresponding one of said N electrostatic discharge protection T-coil center tap port to said N input of said receiver and said P electrostatic discharge protection T-coil center tap port to said P input of said receiver.

2. The apparatus of claim 1, wherein:
said at least one of said P termination network and said N termination network comprises said P termination network;
said at least one delay T-coil comprises a P delay T-coil;
said multiplexer comprises:
  a P multiplexer coupled to said center tap ports of said P electrostatic discharge protection T-coil and said P delay T-coil; and
  an N multiplexer coupled to said center tap ports of said N electrostatic discharge protection T-coil and said N delay T-coil;
said delay mode comprises a P delay mode wherein said P multiplexer selectively connects said P delay T-coil center tap port to said P input of said receiver;

said N termination network further comprises an N delay T-coil having a terminal port, a center tap port, and an input port coupled to said terminal port of said N electrostatic discharge protection T-coil; and said N multiplexer selectively connects said N delay T-coil center tap port to said N input of said receiver and said P multiplexer selectively connects said P electrostatic discharge protection T-coil center tap port to said P input of said receiver in an N delay mode.

3. The apparatus of claim 2, wherein said P multiplexer and said N multiplexer selectively connect said P delay T-coil center tap port to said P input of said receiver and said N delay T-coil center tap port to said N input of said receiver in a PN delay mode.

4. The apparatus of claim 3, further comprising a P dummy capacitive load coupled to said P delay T-coil center tap port and an N dummy capacitive load coupled to said N delay T-coil center tap port in said no delay mode.

5. The apparatus of claim 3, further comprising a P dummy capacitive load coupled to said P primary T-coil center tap port and an N dummy capacitive load coupled to said N delay T-coil center tap port in said P delay mode.

6. The apparatus of claim 3, further comprising an N dummy capacitive load coupled to said N primary T-coil center tap port and a P dummy capacitive load coupled to said P delay T-coil center tap port in said N delay mode.

7. The apparatus of claim 3, further comprising a P dummy capacitive load coupled to said P primary T-coil center tap port and an N dummy capacitive load coupled to said N primary T-coil center tap port in said PN delay mode.

8. The apparatus of claim 3, further comprising a skew select block having an input port coupled to received signal information available from said output of said receiver, a DELAY P output coupled to said P multiplexer and a DELAY N output coupled to said N multiplexer to control said P multiplexer and said N multiplexer to selectively implement one of said no delay mode, said P delay mode, said N delay mode, and said PN delay mode.

9. The apparatus of claim 8, wherein said skew select block comprises logic to select one of said no delay mode, said P delay mode, and said N delay mode, having optimal skew compensation.

10. The apparatus of claim 9, wherein said skew select block determines said optimal skew compensation based on a largest ratio high frequency loss to low frequency loss.

11. The apparatus of claim 9, wherein said skew select block determines said optimal skew compensation based on minimizing high frequency equalization.

12. The apparatus of claim 9, wherein said skew select block determines said optimal skew compensation based on minimizing bit error rate.

13. The apparatus of claim 9, wherein said skew select block determines said optimal skew compensation based on monitoring a soft error rate metric.

14. A method comprising:
coupling a receiver having P and N inputs and having an output to a differential input line pair having a P line and an N line via a P termination network coupling said P line to said P input of said receiver and an N termination network coupling said N line to said N input of receiver;
wherein said P termination network comprises:
a P electrostatic discharge protection T-coil having an input port coupled to said P line, a terminal port, and a center tap port;

wherein said N termination network comprises:
an N electrostatic discharge protection T-coil having an input port coupled to said N line, a terminal port, and a center tap port;
wherein at least one of said P termination network and said N termination network further comprises at least one delay T-coil having a terminal port, a center tap port, and an input port coupled to said terminal port of a corresponding one of said P electrostatic discharge protection T-coil and said N electrostatic discharge protection T-coil; and
with a multiplexer:
in a no delay mode, selectively connecting said P electrostatic discharge protection T-coil center tap port to said P input of said receiver and said N electrostatic discharge protection T-coil center tap port to said N input of said receiver; and
in a delay mode, selectively connecting said delay T-coil center tap port to a corresponding one of said P input of said receiver and said N input of said receiver; and
in said delay mode, selectively connecting another corresponding one of said N electrostatic discharge protection T-coil center tap port to said N input of said receiver and said P electrostatic discharge protection T-coil center tap port to said P input of said receiver.

15. The method of claim 14, wherein:
said at least one of said P termination network and said N termination network comprises said P termination network;
said at least one delay T-coil comprises a P delay T-coil;
said multiplexer comprises:
a P multiplexer coupled to said center tap ports of said P electrostatic discharge protection T-coil and said P delay T-coil; and
an N multiplexer coupled to said center tap ports of said N electrostatic discharge protection T-coil and said N delay T-coil;
said delay mode comprises a P delay mode wherein said P multiplexer selectively connects said P delay T-coil center tap port to said P input of said receiver; and
said N termination network further comprises an N delay T-coil having a terminal port, a center tap port, and an input port coupled to said terminal port of said N electrostatic discharge protection T-coil;
further comprising:
said N multiplexer selectively connecting said N delay T-coil center tap port to said N input of said receiver; and
said P multiplexer selectively connecting said P electrostatic discharge protection T-coil center tap port to said P input of said receiver in an N delay mode.

16. The method of claim 15, further comprising, with said P multiplexer and said N multiplexer, selectively connecting said P delay T-coil center tap port to said P input of said receiver and said N delay T-coil center tap port to said N input of said receiver in a PN delay mode.

17. The method of claim 16, wherein said P termination network further comprises a P dummy capacitive load and said N termination network further comprises an N dummy capacitive load, further comprising:
coupling said P dummy capacitive load to said P delay T-coil center tap port and said N dummy capacitive load to said N delay T-coil center tap port in said no delay mode;

coupling said P dummy capacitive load to said P primary T-coil center tap port and said N dummy capacitive load to said N delay T-coil center tap port in said P delay mode;
coupling said N dummy capacitive load to said N primary T-coil center tap port and said P dummy capacitive load coupled to said P delay T-coil center tap port in said N delay mode; and
coupling said P dummy capacitive load to said P primary T-coil center tap port and said N dummy capacitive load to said N primary T-coil center tap port in said PN delay mode.

18. The method of claim 17, further comprising, with a skew select block having an input port coupled to received signal information available from said output of said receiver, a DELAY P output coupled to said P multiplexer and a DELAY N output coupled to said N multiplexer, controlling said P multiplexer and said N multiplexer to selectively implement one of said no delay mode, said P delay mode, said N delay mode, and said PN delay mode.

19. The method of claim 18, further comprising selecting one of said no delay mode, said P delay mode, and said N delay mode, having optimal skew compensation.

20. The method of claim 19, further comprising determining said optimal skew compensation based on a criterion selected from the group consisting of:
a largest ratio high frequency loss to low frequency loss;
minimizing high frequency equalization;
minimizing bit error rate; and
monitoring a soft error rate metric.

\* \* \* \* \*